(12) United States Patent
Ohara et al.

(10) Patent No.: US 11,545,335 B2
(45) Date of Patent: Jan. 3, 2023

(54) VACUUM CONNECTION MECHANISM AND ELECTRON OPTICAL DEVICE

(71) Applicant: EBARA CORPORATION, Tokyo (JP)

(72) Inventors: Takashi Ohara, Tokyo (JP); Tsutomu Karimata, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 982 days.

(21) Appl. No.: 16/287,268

(22) Filed: Feb. 27, 2019

(65) Prior Publication Data
US 2019/0279839 A1 Sep. 12, 2019

(30) Foreign Application Priority Data

Mar. 8, 2018 (JP) .............................. JP2018-041762

(51) Int. Cl.
| | | |
|---|---|---|
| *H01J 37/26* | (2006.01) | |
| *F16L 51/03* | (2006.01) | |
| *G01N 23/225* | (2018.01) | |
| *F04D 19/04* | (2006.01) | |

(52) U.S. Cl.
CPC .......... *H01J 37/261* (2013.01); *F04D 19/042* (2013.01); *F16L 51/03* (2013.01); *G01N 23/225* (2013.01)

(58) Field of Classification Search
CPC ....... H01J 37/261; F04D 19/042; F16L 51/03; F16L 27/10
See application file for complete search history.

(56) References Cited

U.S. PATENT DOCUMENTS

| | | | |
|---|---|---|---|
| 4,159,133 A | 6/1979 | Belanger | |
| 2014/0291980 A1* | 10/2014 | Miyamoto | ............ F04D 29/605 29/428 |

FOREIGN PATENT DOCUMENTS

| | | | |
|---|---|---|---|
| JP | S5692396 A | * | 1/1981 |
| JP | S56-38598 A | | 4/1981 |
| JP | S5638598 A | * | 4/1981 |
| JP | S56-92396 A | | 7/1981 |
| JP | H04-31675 A | | 2/1992 |
| JP | 2003-083487 A | | 3/2003 |
| JP | 2014-196693 A | | 10/2014 |

* cited by examiner

*Primary Examiner* — David E Smith
(74) *Attorney, Agent, or Firm* — Pearne & Gordon LLP

(57) ABSTRACT

A vacuum connection mechanism includes: a main body part having a first opening and a first sub opening opened symmetrically in a first direction, and a second opening and a second sub opening opened symmetrically in a second direction; a first bellows connected to the first opening and to the end of which a first flange is provided; a first sub bellows connected to the first sub opening and to the end of which a first blind flange is provided; a first supporting member coupling the first flange and the first blind flange; a second bellows connected to the second opening and to the end of which a second flange is provided; a second sub bellows connected to the second sub opening and to the end of which a second blind flange is provided; and a second supporting member coupling the second flange and the second blind flange.

7 Claims, 6 Drawing Sheets

PRIOR ART

PRIOR ART

VACUUM CONNECTION MECHANISM AND ELECTRON OPTICAL DEVICE

CROSS-REFERENCE TO RELATED APPLICATIONS

This application claims the benefit of Japanese Priority Patent Application JP 2018-041762 filed on Mar. 8, 2018, the entire contents of which are incorporated herein by reference.

FIELD

The present technology relates to a vacuum connection mechanism that connects a vacuum pump to a main chamber.

BACKGROUND AND SUMMARY

In an electron optical device such as an electron beam inspection device or an electron beam drawing device that uses an electron beam, a vacuum pump such as a turbomolecular pump that can perform high-vacuum exhaust is connected to a main chamber, in which a sample such as a wafer or a mask is arranged, and the inside of the main chamber needs to be kept in vacuum in order to secure stability and straightness of an electron beam.

Incidentally, since a rotor of a turbomolecular pump rotates at high speed, it is preferable that a main chamber and a vacuum pump such as the turbomolecular pump are elastically connected to each other via a bellows or the like in order to eliminate an influence of vibration generated by the turbomolecular pump on the main chamber as much as possible.

On the one hand, since the turbomolecular pump is a high-speed rotary machine, excessive force is generated not only in the pump itself but also in a pump attachment part or the like in a case where there is a trouble such as breaking of a rotor lock or a rotor during operation, and there is a risk that a damage is generated in a surrounding different device by a fall of the pump in a case where strength of a pump fixation part or the like is not enough. Thus, it is necessary that the turbomolecular pump is attached with enough strength to a structure having secured stiffness.

FIG. 4 is a schematic view illustrating an example of a vacuum connection mechanism in a related art. An exhaust connection part 122a of a main chamber 122 and a vacuum pump 121 are elastically connected to each other via a bellows 112 and a fixation part of the vacuum pump 121 is attached to a fixation side such as a floor with enough stiffness being secured. However, in the configuration illustrated in FIG. 4, although vibration of the vacuum pump 121 can be absorbed by flexibility of the bellows 112, there is a risk that downward force from the bellows 112 acts on the exhaust connection part 122a and the main chamber 122 is inclined by contraction of the bellows 112 due to suction by the vacuum pump 121.

On the other hand, in Japanese Patent Application Laid-Open No. 2014-196693, as illustrated in FIG. 5, a configuration in which a bellows 112a on a vacuum pump 121 side and an auxiliary bellows 112b are connected to an exhaust connection part 122a in a vertically symmetric manner and in which a flange 113a at an end part of the bellows 112a and a blind flange 113b at an end part of the auxiliary bellows 112b are coupled by a supporting member 114 is disclosed. With this configuration, vibration of the vacuum pump 121 can be absorbed by flexibility of the bellows 112a, and upward force acting on the exhaust connection part 122a from the bellows 112a and downward force acting on the exhaust connection part 122a from the auxiliary bellows 112b are balanced in a vertically symmetric manner although contraction force acts on both of the bellows 112a and the auxiliary bellows 112b due to suction by the vacuum pump 121. Thus, a trouble that a main chamber 122 is inclined is not generated.

Incidentally, with reference to FIG. 6, a bellows has a characteristic of being soft in an expansion/contraction direction (Z direction) and an XY direction perpendicular thereto and being hard (having high stiffness) in a rotational direction around an axis (θ direction) because of an accordion shape thereof.

Thus, in the configuration illustrated in FIG. 5, vibration in the Z direction and the XY direction of the vacuum pump 121 can be absorbed by flexibility of the bellows 112a. However, vibration in the rotational direction around the axis (θ direction) cannot be absorbed by the bellows 112a, and may be transmitted to a main chamber 112 and have a bad influence.

It is demanded to provide a vacuum connection mechanism with an improved vibration absorption effect.

A vacuum connection mechanism according to one embodiment includes:

a main body part having a first main opening and a first sub opening opened mutually symmetrically in a first axial direction, and a second main opening and a second sub opening opened mutually symmetrically in a second axial direction different from the first axial direction;

a first main bellows one end of which is connected to the first main opening and to the other end of which a first flange connected to a vacuum pump side is provided;

a first sub bellows one end of which is connected to the first sub opening and to the other end of which a first blind flange is provided;

a first supporting member coupling the first flange and the first blind flange;

a second main bellows one end of which is connected to the second main opening and to the other end of which a second flange connected to a main chamber side is provided;

a second sub bellows one end of which is connected to the second sub opening and to the other end of which a second blind flange is provided; and a second supporting member coupling the second flange and the second blind flange.

DETAILED DESCRIPTION OF NON-LIMITING EXAMPLE EMBODIMENTS

Figure 1:
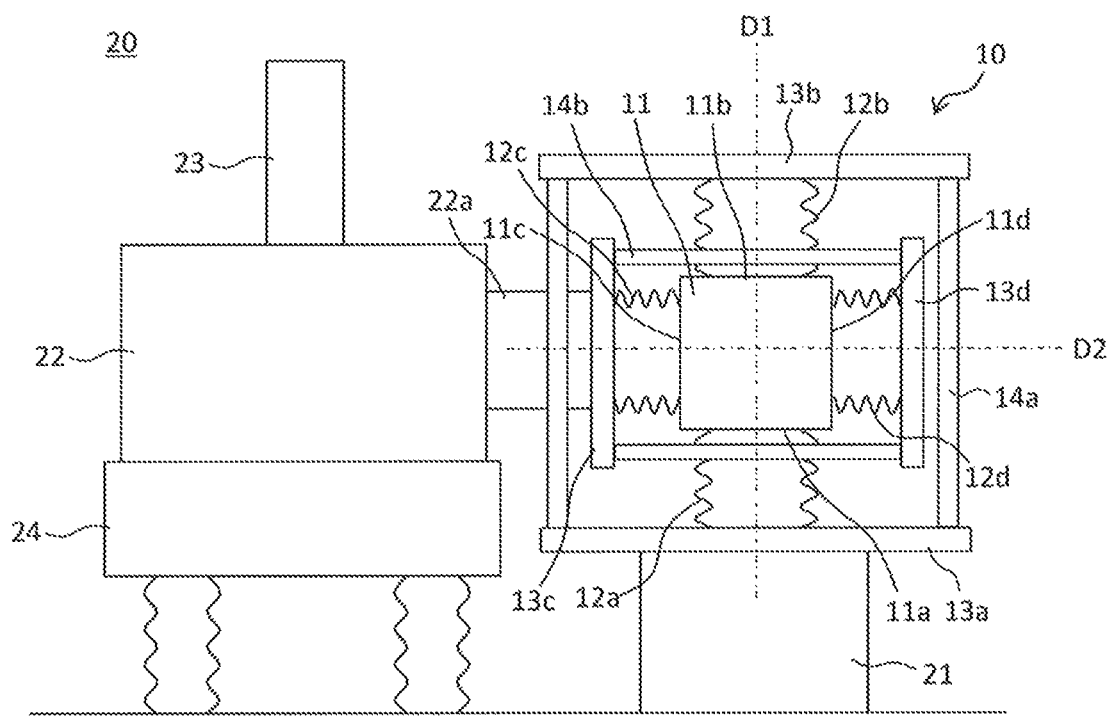
FIG. 1 is a view illustrating a configuration of an electron optical device including a vacuum connection mechanism according to one embodiment.

A vacuum connection mechanism according to one aspect of an embodiment includes:

a main body part having a first main opening and a first sub opening opened mutually symmetrically in a first axial direction, and a second main opening and a second sub opening opened mutually symmetrically in a second axial direction different from the first axial direction;

a first main bellows one end of which is connected to the first main opening and to the other end of which a first flange connected to a vacuum pump side is provided;

a first sub bellows one end of which is connected to the first sub opening and to the other end of which a first blind flange is provided;

a first supporting member coupling the first flange and the first blind flange;

a second main bellows one end of which is connected to the second main opening and to the other end of which a second flange connected to a main chamber side is provided;

a second sub bellows one end of which is connected to the second sub opening and to the other end of which a second blind flange is provided; and a second supporting member coupling the second flange and the second blind flange.

According to such an aspect, although contraction force acts on each bellows due to suction by the vacuum pump, force acting on the main body part from the first main bellows and that from the first sub bellow are balanced oppositely in the first axial direction, and force acting on the main body part from the second main bellows and that from the second sub bellows are also balanced oppositely in the second axial direction. Thus, a problem that the main chamber is pulled to the vacuum pump side and inclined is not generated. Also, vibration in the first axial direction (Z direction) and in an XY direction perpendicular thereto of the vacuum pump can be absorbed by flexibility of the first main bellows and the first sub bellows, and vibration in a rotational direction around an axis (θ direction) of the vacuum pump can be also absorbed by flexibility of the second main bellows and the second sub bellows. Thus, it is possible to improve a vibration absorption effect in the vacuum connection mechanism and to reduce a possibility that vibration of the vacuum pump is transmitted to the main chamber and has a bad influence.

In the vacuum connection mechanism according to the one aspect of the embodiment, the second axial direction may be a direction orthogonal to the first axial direction.

In the vacuum connection mechanism according to the one aspect of the embodiment, the first axial direction may be a vertical direction and the second axial direction may be a horizontal direction.

In the vacuum connection mechanism according to the one aspect of the embodiment, the second main bellows, the second sub bellows, and the second supporting member may be arranged between the first flange and the first blind flange.

According to such an aspect, it is possible to configure a vacuum connection mechanism compactly.

In the vacuum connection mechanism according to the one aspect of the embodiment, the main body part may have a hollow box shape.

In the vacuum connection mechanism according to the one aspect of the embodiment, the main body part may have a cross pipe shape.

An electron optical device according to one aspect of the embodiment includes:

a vacuum connection mechanism having any of the above-described characteristics;

a vacuum pump connected to the first flange side of the vacuum connection mechanism;

a main chamber connected to the second flange side of the vacuum connection mechanism; and an optical column that is connected to the main chamber and that supplies an electron beam to a sample arranged in the main chamber.

In the following, a detailed example of an embodiment will be described in detail with reference to the attached drawings. Note that in the drawings attached to the present description, a scale, an aspect ratio, and the like are arbitrarily changed and exaggerated from those of real one for convenience of making it easy to understand the drawings.

FIG. 1 is a view illustrating a configuration of an electron optical device 20 including a vacuum connection mechanism 10 according to one embodiment. Note that in the following description, an electron beam inspection device will be described as an example of the electron optical device 20. However, the electron optical device 20 is not limited to the electron beam inspection device and may be an electron beam emission device, an electron beam drawing device, or an electron microscope.

As illustrated in FIG. 1, the electron optical device 20 includes a main chamber 22, an optical column 23 that is connected to the main chamber 22 and that supplies an electron beam to a sample arranged in the main chamber 22, an anti-vibration table 24 that supports the main chamber 22 with respect to the ground (floor), a vacuum pump 21, and a vacuum connection mechanism 10 that connects the vacuum pump 21 to an exhaust connection part 22a of the main chamber 22.

Since configurations of the main chamber 22, the optical column 23, and the anti-vibration table 24 among these are similar to those of an electron optical device in a related art, a detailed description is omitted.

The vacuum pump 21 is not specifically limited as long as high-vacuum exhaust from the main chamber 22 is possible. For example, a turbomolecular pump or a dry pump is used. In the example illustrated in FIG. 1, the vacuum pump 21 is attached to the ground (floor) with enough strength.

As illustrated in FIG. 1, the vacuum connection mechanism 10 according to the present embodiment has a main body part 11, a first main bellows 12a and a first sub bellows 12b arranged mutually symmetrically in a first axial direction D1 with respect to the main body part 11, a second main bellows 12c and a second sub bellows 12d arranged mutually symmetrically in a second axial direction D2 with respect to the main body part 11, a first supporting member 14a, and a second supporting member 14b.

Here, the second axial direction D2 is a direction different from the first axial direction D1 and is, for example, a direction orthogonal to the first axial direction D1. In the example illustrated in FIG. 1, the first axial direction D1 is a vertical direction and the second axial direction D2 is a horizontal direction. However, this is not the limitation and a first axial direction D1 and a second axial direction D2 may be horizontal directions orthogonal to each other.

Figure 2:
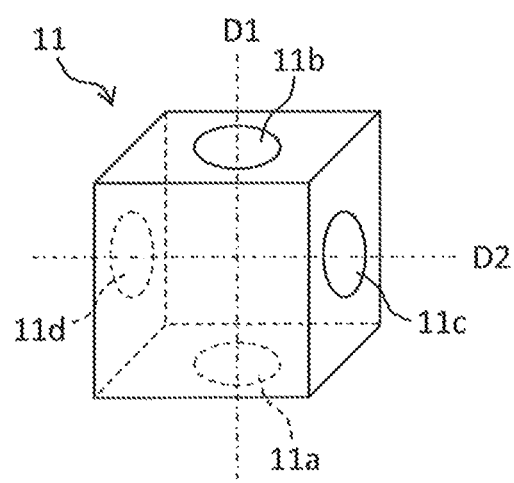
FIG. 2 is a perspective view illustrating an example of a main body part of the vacuum connection mechanism illustrated in FIG. 1.

FIG. 2 is a perspective view illustrating an example of the main body part 11. In the example illustrated in FIG. 2, the main body part 11 has a hollow box shape, and has a first main opening 11a and a first sub opening 11b opened mutually symmetrically (oppositely) in the first axial direction D1, and a second main opening 11c and a second sub opening 11d opened mutually symmetrically (oppositely) in the second axial direction D2.

In the illustrated example, the first main opening 11a and the first sub opening 11b have an identical size and the second main opening 11c and the second sub opening 11d have an identical size. All of the first main opening 11a, the first sub opening 11b, the second main opening 11c, and the second sub opening 11d may have an identical size. In this case, since it is not necessary to care about a direction of the main body part 11 in assembling of the vacuum connection mechanism 10, work efficiency is high.

Figure 3:
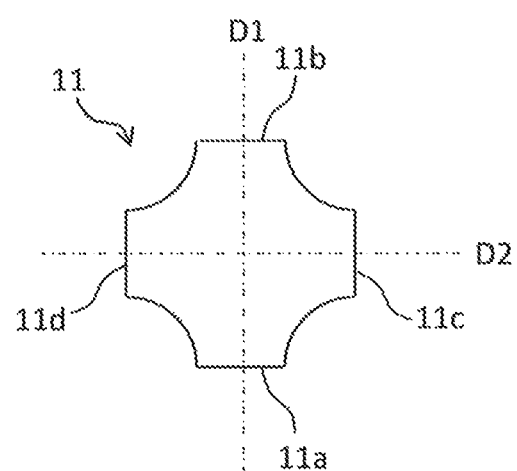
FIG. 3 is a side view illustrating an example of the main body part of the vacuum connection mechanism illustrated in FIG. 1.
Figure 4:
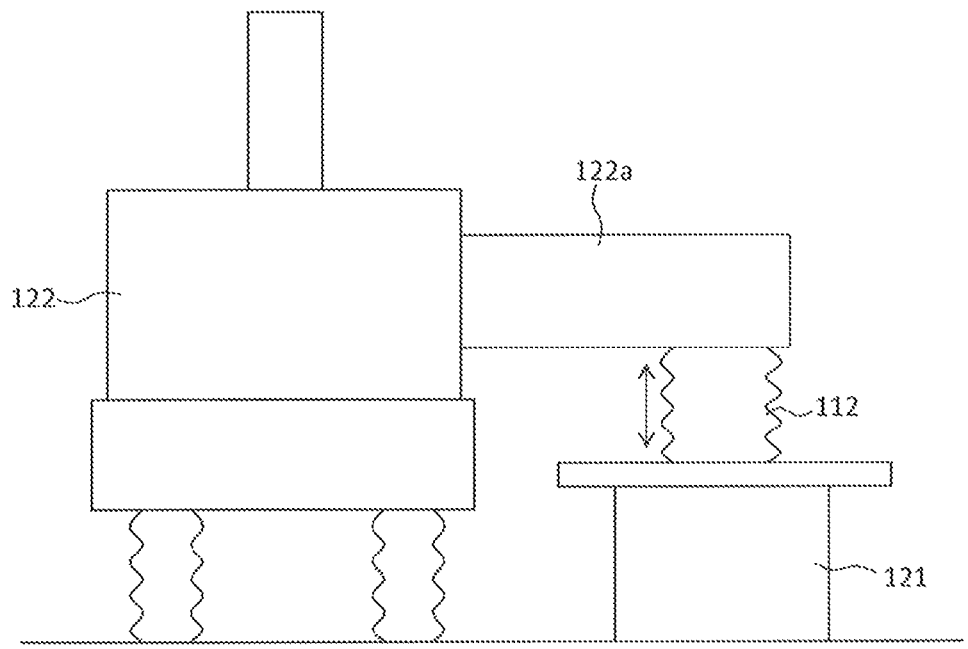
FIG. 4 is a schematic view illustrating an example of a vacuum connection mechanism in a related art.

Note that a shape of the main body part 11 is not limited to the hollow box shape in a manner illustrated in FIG. 2 and may be, for example, a cross pipe (cross) shape as illustrated in FIG. 3. As a material of the main body part 11, metal such as stainless steel is used.

As illustrated in FIG. 1, one end of the first main bellows 12a is connected to the first main opening 11a of the main body part 11, and a first flange 13a connected to the vacuum pump 21 side is provided to the other end thereof. The first flange 13a may be directly connected to an inlet flange of the vacuum pump 21 or may be connected to the inlet flange via a pipe (not illustrated).

One end of the first sub bellows 12b is connected to the first sub opening 11b of the main body part 11 and a first blind flange 13b is provided to the other end thereof.

As the first main bellows 12a and the first sub bellows 12b, a metal (such as stainless steel) welding bellows is used. In the illustrated example, the first main bellows 12a and the first sub bellows 12b have an identical shape.

As illustrated in FIG. 1, the first flange 13a at the end part of the first main bellows 12a and the first blind flange 13b at the end part of the first sub bellows 12b are coupled by the first supporting member 14a. Thus, even when the inside of the first main bellows 12a and the first sub bellows 12b become negative pressure due to suction by the vacuum pump 21 and there is action of contraction force in the first axial direction D1, contraction and deformation of the first main bellows 12a and the first sub bellows 12b are prevented since the both end parts are supported by the first supporting member 14a.

Note that in the illustrated example, the first supporting member 14a has a bar shape in parallel with the first axial direction D1. However, this is not the limitation, and the first supporting member 14a may have a shape surrounding the first main bellows 12a, the first sub bellows 12b, and the main body part 11 in a tubular manner. In this case, the first supporting member 14a only needs to have a hole into which the exhaust connection part 22a of the main chamber 22 is inserted.

As illustrated in FIG. 1, one end of the second main bellows 12c is connected to the second main opening 11c of the main body part 11, and a second flange 13c connected to the main chamber 22 side is provided to the other end thereof. The second flange 13c may be directly connected to the exhaust connection part 22a of the main chamber 22 or may be connected to the exhaust connection part 22a via a pipe (not illustrated).

One end of the second sub bellows 12d is connected to the second sub opening 11d of the main body part 11, and a second blind flange 13d is provided to the other end thereof.

As the second main bellows 12c and the second sub bellows 12d, a metal (such as stainless steel) welding bellows is used. In the illustrated example, the second main bellows 12c and the second sub bellows 12d have an identical shape.

As illustrated in FIG. 1, the second flange 13c at the end part of the second main bellows 12c and the second blind flange 13d at the end part of the second sub bellows 12d are coupled by the second supporting member 14b. Thus, even when the inside of the second main bellows 12c and the second sub bellows 12d become negative pressure due to suction by the vacuum pump 21 and there is action of contraction force in the second axial direction D2, contraction and deformation of the second main bellows 12c and the second sub bellows 12d are prevented since the both end parts are supported by the second supporting member 14b.

Note that in the illustrated example, the second supporting member 14b has a bar shape in parallel with the second axial direction D2. However, this is not the limitation, and the second supporting member 14b may have a shape surrounding the second main bellows 12c, the second sub bellows 12d, and the main body part 11 in a tubular manner. In this case, the second supporting member 14b only needs to have a hole into which the first main bellows 12a and the first sub bellows 12b are inserted.

In the present embodiment, as illustrated in FIG. 1, the second main bellows 12c, the second sub bellows 12d, and the second supporting member 14b are arranged between the first flange 13a at the end part of the first main bellows 12a and the first blind flange 13b at the end part of the first sub bellows 12b. Thus, a size in the first axial direction D1 of the vacuum connection mechanism 10 is prescribed by a distance between the first flange 13a and the first blind flange 13b, that is, by a length in the first axial direction D1 of the first supporting member 14a, and does not become larger than that. Thus, it is possible to configure the vacuum connection mechanism 10 compactly.

Figure 5:
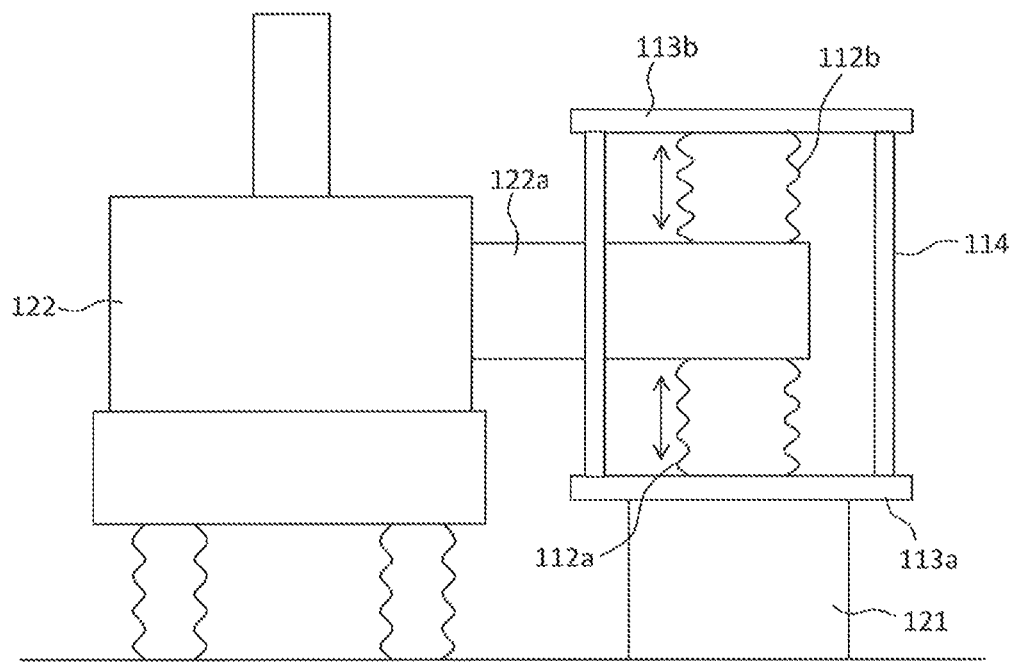
FIG. 5 is a schematic view illustrating a modification example of a vacuum connection mechanism in a related art.
Figure 6:
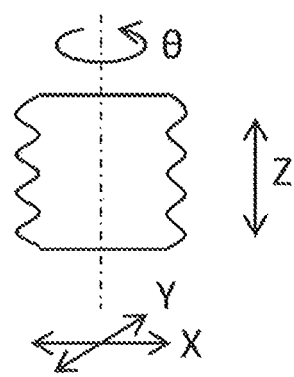
FIG. 6 is a view for describing a characteristic of a bellows.

Incidentally, with reference to FIG. 6, a bellows has a characteristic of being soft in an expansion/contraction direction (Z direction) and in an XY direction perpendicular thereto and being hard (having high stiffness) in a rotational direction around an axis (θ direction) because of an accordion shape thereof. Thus, in a configuration of a vacuum connection mechanism in a related art in a manner illustrated in FIG. 5, although vibration in a Z direction and an XY direction of a vacuum pump 121 can be absorbed by flexibility of a bellows 112a, vibration in a rotational direction around an axis (θ direction) cannot be absorbed by the bellows 112a and may be transmitted to a main chamber 112 and have a bad influence.

On the other hand, according to the present embodiment, although contraction force acts on the bellows 12a to 12d due to suction by the vacuum pump 21, force acting on the main body part 11 from the first main bellows 12a and that from the first sub bellows 12b are balanced oppositely in the first axial direction D1, and force acting on the main body part 11 from the second main bellows 12c and that from the second sub bellows 12d are also balanced oppositely in the second axial direction D2. Thus, a problem that the main chamber 22 is pulled to the vacuum pump 21 side and inclined is not generated.

Also, according to the present embodiment, vibration in the first axial direction D1 (Z direction) and the XY direction perpendicular thereto of the vacuum pump 21 can be absorbed by flexibility of the first main bellows 12a and the first sub bellows 12b.

Moreover, displacement in the rotational direction around the axis (θ direction) of the vacuum pump 21 is only composition of displacement in the expansion/contraction direction (Z direction) and the XY direction perpendicular thereto when seen from the second main bellows 12c and the second sub bellows 12d. Thus, displacement in the rotational direction around the axis (θ direction) of the vacuum pump 21 can be effectively absorbed by flexibility of the second main bellows 12c and the second sub bellows 12d. Thus, according to the present embodiment, it is possible to improve a vibration absorption effect in the vacuum connection mechanism 10 and to greatly reduce a possibility that vibration of the vacuum pump 21 is transmitted to the main chamber 22 and have a bad influence.

In the above, an embodiment of the present technology has been described with examples. However, scope of the present technology is not limited to these and a change/modification can be made according to a purpose within the scope described in claims.

What is claimed is:

1. A vacuum connection mechanism comprising:
    a main body part having a first main opening and a first sub opening being opposite to each other in a first axial direction, and a second main opening and a second sub opening being opposite to each other in a second axial direction different from the first axial direction;
    a first main bellows one end of which is connected to the first main opening and to the other end of which a first flange connected to a vacuum pump side is provided;
    a first sub bellows one end of which is connected to the first sub opening and to the other end of which a first blind flange is provided;
    a first supporting member coupling the first flange and the first blind flange;
    a second main bellows one end of which is connected to the second main opening and to the other end of which a second flange connected to a main chamber side is provided;
    a second sub bellows one end of which is connected to the second sub opening and to the other end of which a second blind flange is provided; and
    a second supporting member coupling the second flange and the second blind flange.

2. The vacuum connection mechanism according to claim 1, wherein the second axial direction is a direction orthogonal to the first axial direction.

3. The vacuum connection mechanism according to claim 2, wherein the first axial direction is a vertical direction, and the second axial direction is a horizontal direction.

4. The vacuum connection mechanism according to claim 1, wherein the second main bellows, the second sub bellows, and the second supporting member are arranged between the first flange and the first blind flange.

5. The vacuum connection mechanism according to claim 1, wherein the main body part has a hollow box shape.

6. The vacuum connection mechanism according to claim 1, wherein the main body part has a cross pipe shape.

7. An electron optical device comprising:
    the vacuum connection mechanism according to claim 1;
    a vacuum pump connected to the first flange side of the vacuum connection mechanism;
    a main chamber connected to the second flange side of the vacuum connection mechanism; and
    an optical column that is connected to the main chamber and that supplies an electron beam to a sample arranged in the main chamber.

* * * * *